(12) United States Patent
Klebanoff et al.

(10) Patent No.: US 6,253,464 B1
(45) Date of Patent: Jul. 3, 2001

(54) METHOD FOR PROTECTION OF LITHOGRAPHIC COMPONENTS FROM PARTICLE CONTAMINATION

(75) Inventors: Leonard E. Klebanoff, San Ramon; Daniel J. Rader, Lafayette, both of CA (US)

(73) Assignee: Euv LLC, Santa Clara, CA (US)

( * ) Notice: Subject to any disclaimer, the term of this patent is extended or adjusted under 35 U.S.C. 154(b) by 0 days.

(21) Appl. No.: 09/642,222

(22) Filed: Aug. 18, 2000

Related U.S. Application Data

(62) Division of application No. 09/071,359, filed on Apr. 30, 1998, now Pat. No. 6,153,044.

(51) Int. Cl.[7] .................................................. F26B 5/04
(52) U.S. Cl. .................. 34/403; 34/428; 34/446; 34/448; 34/493; 34/494; 34/508; 156/345; 118/715; 118/722; 118/723 R; 118/724
(58) Field of Search .............................. 34/402, 403, 428, 34/446, 448, 493, 494, 508; 156/345, 20, 22, 40, 1, 4; 438/909; 118/715, 722, 723 R, 724

(56) References Cited

U.S. PATENT DOCUMENTS

| | | | | |
|---|---|---|---|---|
| 4,728,389 | * | 3/1988 | Logar | 156/612 |
| 5,366,559 | * | 11/1994 | Periasamy | 134/1 |
| 5,373,806 | * | 12/1994 | Logar | 117/106 |
| 5,472,550 | * | 12/1995 | Periasamy | 156/345 |
| 5,888,579 | * | 3/1999 | Lun | 427/8 |
| 6,106,634 | * | 8/2000 | Ghanayem et al. | 134/19 |
| 6,161,311 | * | 12/2000 | Doley et al. | 34/548 |

* cited by examiner

*Primary Examiner*—Pamela Wilson
(74) *Attorney, Agent, or Firm*—Donald A. Nissen

(57) ABSTRACT

A system that employs thermophoresis to protect lithographic surfaces from particle deposition and operates in an environment where the pressure is substantially constant and can be sub-atmospheric. The system (thermophoretic pellicle) comprises an enclosure that surrounds a lithographic component whose surface is being protected from particle deposition. The enclosure is provided with means for introducing a flow of gas into the chamber and at least one aperture that provides for access to the lithographic surface for the entry and exit of a beam of radiation, for example, and further controls gas flow into a surrounding low pressure environment such that a higher pressure is maintained within the enclosure and over the surface being protected. The lithographic component can be heated or, alternatively the walls of the enclosure can be cooled to establish a temperature gradient between the surface of the lithographic component and the walls of the enclosure, thereby enabling the thermophoretic force that resists particle deposition.

5 Claims, 1 Drawing Sheet

METHOD FOR PROTECTION OF LITHOGRAPHIC COMPONENTS FROM PARTICLE CONTAMINATION

CROSS-REFERENCE TO RELATED APPLICATIONS

This application is a Division of prior application Ser. No. 09/071,359, filed Apr. 30, 1998 now U.S. Pat. No. 6,153,044.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

BACKGROUND OF THE INVENTION

This invention pertains generally to method and apparatus for preventing surface contamination by deposition of particulate matter and more particularly to preventing deposition of particulate matter onto lithographic components such as reticles (masks) and wafers during lithographic use, fabrication, inspection, repair, handling and storage.

The ability to produce high quality microelectronic devices and reduce yield losses is strongly dependent upon maintaining the surfaces substantially defect-free. This is particularly true as design rules drive integrated circuits to finer feature size. Generally, surface defects can be related to particulate matter being deposited onto surfaces of reticles (masks) and wafer substrates during the various operations required to produce integrated circuits. The need to maintain these surfaces substantially free of particulate matter has long been recognized in the microelectronics industry and various schemes to do so have been proposed, such as those set forth in U.S. Pat. Nos. 5,373,806 and 5,472,550. The former discloses the use of thermal energy, such as the use of radiant energy, RF, or resistance heating, to substantially eliminate electrostatic attraction as a mechanism for particle transport and deposition during gas phase processing while the latter describes the use of the photophoretic effect to capture particles by projecting a laser beam inside the processing chamber along a trajectory that does not contact the substrate surface.

The concern about printable defects caused by particle deposition onto surfaces is of particular importance for the next generation of lithographies, including proximity x-ray lithography, direct-write and projection electron-beam lithography (SCALPEL), direct-write and projection ion-beam lithography, and extreme ultraviolet (radiation having a wavelength in the region of 3.5–15 nm) lithography (EUVL) which must provide for exclusion of particles with diameters greater than 0.01 $\mu$m. The situation is exacerbated by the fact that for a beam of high energy radiation (photons, electrons, ions, or atoms), such as used for the aforementioned advanced lithographies, a pellicle which is customarily employed to protect lithographic reticles (masks) from particle deposition cannot be used. The protective benefit provided by a protective membrane such as a pellicle is negated by its deleterious effect on the beam of high energy incident radiation. By way of example, a half micron thick Si film will reduce the light intensity at 13 nm by 60%, which is an intolerable reduction for most lithographic applications. Coupled with this is the difficulty of forming a durable pellicle consisting of a ½ $\mu$m Si film. In the case of electron lithography, the pellicle will absorb some of the electron current and, by inelastic scattering, introduce undesirable chromatic aberration into the electron beam and intolerable deviations in beam angle. While it is possible to produce organic polymeric materials in the proper thickness to form pellicles, they suffer from the disadvantage that they will decompose under the influence of high energy radiation, releasing volatile degradation products which, in turn, will coat optical surfaces and reduce their efficiency. Moreover, many of the advanced lithographic concepts must operate in a vacuum to reduce degradation of high energy radiation used for finer design rules consequently, the pellicle surface will be subjected to large changes in pressure (from 760 Torr to $5 \times 10^{-4}$ Torr) over a surface area that may be as large as 100 cm$^2$ and thus, forces larger than a thin organic membrane pellicle can withstand will be generated.

Because of the importance of protecting lithographic surfaces, such as reticles, from deposition of particulate matter for next generation lithographies alternative protection schemes such as clean encapsulation of the exposure chamber, protective gas blankets, and in-situ cleaning of mask surfaces are being investigated. However, each of these alternative schemes has disadvantages and none have been developed to the point of application.

What is needed is a means to protect lithographic surfaces, such as those of the reticle and wafer, from particle deposition without comprising lithographic performance or contaminating lithographic optical elements. Moreover, in order to be useful in advanced lithographic applications it is necessary that the protecting means operate effectively in a sub-atmospheric pressure environment.

SUMMARY OF THE INVENTION

The present invention generally employs a physical phenomenon known as thermophoresis to protect lithographic surfaces from particle deposition and is particularly designed to operate in an environment where the pressure is substantially constant and can be sub-atmospheric. Protection from particle deposition is afforded during lithographic use, fabrication, repair, handling, and storage without compromising lithographic performance or contaminating other lithographic components.

Thermophoresis can be a useful tool to overcome particle deposition onto surfaces because it is capable of overwhelming those mechanisms that lead to particle deposition such as: 1) electrostatic forces, 2) inertia, 3) Brownian motion, and 4) gravity. Thermophoretic forces operate to cause particles to be driven from regions of higher gas temperature to regions of lower gas temperature. However, it is known that the thermophoretic effect begins to become less effective as gas pressure is lowered, generally precluding its use where the surface to be protected is held at pressures below about 5 m Torr, as can be the case in many lithographic operations and, particularly for advanced lithographic concepts where operation in a vacuum is necessary to reduce attenuation of the radiation. The present invention discloses a novel system that reduces particle deposition onto a surface by the use of thermophoresis, directed gas flow to isolate the surface from particles in the environment, orientation of the surface to eliminate gravitational deposition, and elimination of electric fields to protect the surface from electrostatic deposition. This invention is designed to provide particle protection in situations where the atmosphere is at substantially constant but sub-atmospheric pressure. However, because of the novel features of this invention, which have been disclosed above, the present invention can also be used in those applications where the surrounding atmosphere is at atmospheric pressure or above.

Because the system of the present invention functions in a manner similar to that of a conventional pellicle and for ease of description the system disclosed herein will be referred to hereinafter as a thermophoretic pellicle. While intended principally to provide protection to reticles (hereinafter the terms reticle and mask will be used interchangeably and synonymously) from particle deposition during operation of the lithographic process, it is contemplated that the thermophoretic pellicle can also provide protection for a reticle during fabrication, inspection and repair as well as storage, manual and robotic handling. Furthermore, the protection provided by the thermophoretic pellicle can extend to other critical lithographic components such as wafers, wafer chucks, filters, lenses, mirrors and reticle stages.

The thermophoretic pellicle, which is generally deployed in a chamber operating at a sub-atmospheric pressure, comprises an enclosure that surrounds a lithographic component having a surface needing protection from particle deposition, means for introducing a flow of gas into the enclosure, and at least one aperture that provides access to the surface being protected. Here, access is defined as permitting the entry and/or exit of a beam of radiation as well as the exit and control of the gas flow from the interior of the thermophoretic pellicle into the environment of the chamber containing the thermophoretic pellicle as well as admitting entry of mechanical devices, such as the probe of an atomic force microscope, into the thermophoretic pellicle. The surface of the lithographic component can be heated or, alternatively, the walls of the enclosure can be cooled to establish the required temperature gradient between the warmer surface lithographic component and the cooler walls of the enclosure that provides the desired thermophoretic force.

The present invention further provides protection from particle deposition onto a surface by employing a gas flow regime that directs particles away from the protected surface, substantially eliminates undesirable electrostatic deposition by the use of electrostatic shielding, and removes gravitational deposition by preferably positioning the surface being protected in a downward facing orientation.

In order to better understand and appreciate its nature and scope the present invention will now be described more fully hereinafter by way of various embodiments illustrative of the invention. This invention may, however, be embodied in many different forms and should not be construed as limited only to the embodiments set forth herein but as defined by the appended claims.

DETAILED DESCRIPTION OF THE INVENTION

Figure 1:
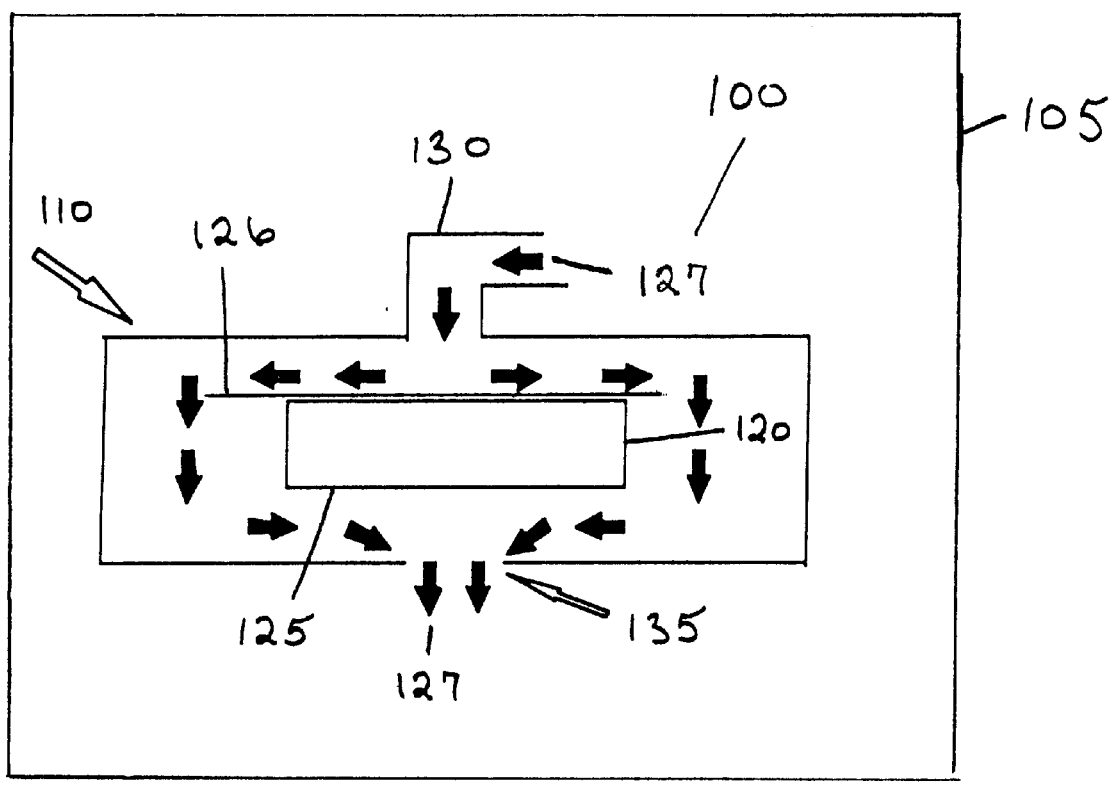
FIG. 1 shows an embodiment of the present invention.

The present invention discloses a system, the thermophoretic pellicle, designed to operate in an environment where the pressure is substantially constant, and can be sub-atmospheric, and employs a physical phenomenon known as thermophoresis to reduce the particle count on the surface of lithographic components by a factor of as much as $10^6$ for particles having diameters as small as 0.01 µm by overwhelming those mechanisms that lead to particle deposition.

It is well known that surfaces can be protected from particle deposition by thermophoresis. By maintaining these surfaces at temperatures higher than their surroundings, particles are caused to migrate away from the heated surfaces. There are two critical features associated with thermophoresis generally and the thermophoretic pellicle of the present invention in particular: 1) a temperature gradient must be developed in the gas resident between the surface of the lithographic component being protected from particle deposition and its surroundings; the surface of the lithographic component being warmer than its surroundings, and 2) the gas pressure must be sufficiently high to enable sufficient collisions between gas molecules and particles to develop a thermophoretic force. Thus, while thermophoresis vanishes in a perfect vacuum, pressures above about 100 mTorr are sufficient to establish, in most gases, a well defined temperature gradient and are preferred, however, useful thermophoretic protection can be established at pressures below about 100 mTorr, although with a lowered effectiveness.

As gas pressure decreases below about 100 mTorr, the continuum nature of the gas begins to break down and the gas is less able to maintain the desired temperature gradient needed to promote thermophoresis and, as a consequence, the effectiveness of thermophoretic protection is degraded. For those lithographic systems that require low overall system pressures for satisfactory performance, such as EUV lithography, direct-write and projection electron beam lithography (SCALPEL), direct-write and projection ion beam lithography, and vacuum materials processing, it is necessary to provide for a region of locally high pressure in the vicinity of the lithographic component being protected in order for therinophoresis to be effective, while simultaneously maintaining the general system environment at the necessary low operating pressure. In the present invention this is done by surrounding the lithographic component by an enclosure (the thermophoretic pellicle) that can be differentially pumped, thereby providing a region of locally higher pressure around the lithographic component to permit thermophoretic protection of the surface. The thermophoretic pellicle further provides for a gas flow that not only sweeps particles out of the pellicle but also eliminates the flow of particles and contaminants from the chamber environment outside the thermophoretic pellicle into the enclosure holding the protected surface. Moreover, particle deposition due to electrostatic attraction is substantially eliminated by eliminating electrical fields in the vicinity of the protected surface. Finally, particle deposition due to gravitational effects is eliminated by orienting the protected surface in a downwardly facing orientation.

FIG. 1 shows a schematic representation of an embodiment of the thermophoretic pellicle 100 that comprises, in part, the present invention. Typically, thermophoretic pellicle 100 is contained within a system chamber 105 that establishes and maintains the general system operating pressure which is constant but can range from atmospheric to sub-atmospheric or supraatmospheric. In those instances where the general system operating pressure is sub-atmospheric as would be the case, for example for advanced lithography systems such as EUV lithography, direct write and projection electron beam lithography (SCALPEL), ion beam lithography, system chamber 105 is provided with pumping means to maintain a low operating pressure within the chamber. Chamber 105 can house a lithographic apparatus, or a reticle fabrication apparatus, or an inspection apparatus and establishes the operating environment in which the thermophoretic pellicle must operate. Here, the walls 110 of thermophoretic pellicle 100 enclose a reticle 120 whose surface 125 is to be protected from particle deposition, wherein surface 125 is oriented in a downwardly facing direction and is maintained at a higher temperature than walls 110. Walls 110 can be made of any material but materials having high thermal conductivity such as silicon are preferred. Metals such as aluminum or copper are particularly preferred because of their high thermal conductivity. Morever, the use of a metal for the walls of the thermophoretic pellicle eliminates one potential source of contamination, outgassing of the organic materials from which most conventional pellicles are typically made. It is also desirable to eliminate electrical fields from the vicinity of the reticle by constructing enclosure walls 110 from materials having high electrical conductivity, such as a metal, and to equalize any voltage difference between surface 125 and the enclosure walls 110, for example, by grounding both or by simple electrical connection.

Thermophoretic pellicle 100 is also provided with at least one gas inlet means 130 to permit flow of a gas into the interior of the enclosure. It will be appreciated that the gas be as free of particulate matter as possible in order to prevent extraneous particle deposition. Gas flow out of the interior of thermophoretic pellicle 100 is restricted by aperture 135 so as to maintain the pressure inside thermophoretic pellicle 100 at a value sufficient to provide effective thermophoretic protection. It is preferred that the pressure within thermophoretic pellicle 100 be at least about 30 mTorr, however, useful thermophoretic protection can be achieved where the pressure in the interior of thermophoretic pellicle 100 is as low as about 1 mTorr. Any gas can be used to maintain the pressure in the interior of the pellicle enclosure, however, a gas having a low molecular weight and high viscosity such as $H_2$, He, or Ne is preferred. For EUV applications Ar is preferred because it possesses a low cross-section for the absorption of EUV radiation, moreover, it is relatively easy to differentially pump.

Pellicle 100 is further provided with at least one aperture 135 that can be of any shape and which not only provides access to surface 125 for the entry and/or exit of a beam of radiation, as well as mechanical devices, but also permits gas flow out of the thermophoretic pellicle, thereby acting as a gas conduction barrier allowing differential pumping of the enclosure. The gas flowing out of thermophoretic pellicle 100 through aperture 135 also acts to exclude from the interior of the thermophoretic pellicle particles and other contamination having its origin in system chamber 105. The ability to differentially pump the thermophoretic pellicle, i.e., maintain an elevated pressure in the interior of the pellicle enclosure and over surface 125, relative to the pressure within chamber 105, makes it possible to employ the thermophoretic pellicle in applications where a low background pressure must be maintained within chamber 105. The inventors have shown that in the configuration shown in FIG. 1, wherein the distance between the surface being protected and the proximate enclosure wall is ≈1 cm, the temperature difference between the two is 10 K, the interior pressure is 30 mTorr, and the operating pressure in chamber 105 is <5 mTorr, it is possible to reduce deposition of particles greater than 0.03 μm in diameter by a factor of about $10^6$. It should be noted that the locations of the gas inlets and apertures, relative to the position of reticle 120, are chosen such as to cause gas flow 127 to be substantially parallel to and away from surface 125, thereby eliminating inertial deposition of particles onto the surface 125 of reticle 120, and reducing entry of particles or other contaminants into thermophoretic pellicle 100.

Reticle 120 can be mounted on any suitable mounting means 126, such as an electrostatic chuck or an x-y stage. It is preferred that reticle 120 be mounted with surface 125 facing downward to eliminate particle deposition by gravitational settling. Mounting means 126 can be used as a source of radiative, convective, or conductive heat to heat reticle 120, a radiative heat source can be used to heat the surface 125, or a source of inductive heat can be provided, all in order to establish a temperature gradient between surface 125 and the walls 110 of pellicle 100. Alternatively, walls 110 can be cooled by thermoelectric means or the use of flowing cooled fluids.

The degree of thermophoretic protection afforded a surface is a function of both the pressure of the gas within the thermophoretic pellicle and the temperature gradient existing between the walls and the surface being protected. The inventors have shown that the effectiveness of thermophoretic protection is determined, principally by the difference in temperature between the walls of the thermophoretic pellicle enclosure and the surface being protected and to a lesser extent by the absolute temperatures of the reticle and walls of the enclosure. It is preferred that there be a temperature gradient of at least about 1 K/cm between the surface of the reticle and the enclosure walls, wherein the surface of the reticle is warmer than the enclosure walls, coupled with a gas pressure within the thermophoretic pellicle of at least about 30 mTorr.

In the embodiment shown if FIG. 1 the thermophoretic pellicle is used to protect a reticle during the lithographic exposure operation and the pellicle is oriented such that the protected surface desirably faces in a downward direction. It will be appreciated by those skilled in the art that the thermophoretic pellicle disclosed here can also be used in many other lithographic operations, such as protection of a wafer during exposure, inspection, storage, and handling; protection of reticles during fabrication by such processes as sputtering of metallic and semiconducting layers, ion sputtering, thermal evaporation, or molecular beam epitaxy; and reticle Inspection and repair. In many of these applications it is possible that the thermophoretic pellicle cannot be used in the orientation illustrated in FIG. 1, i.e., with the protected surface oriented in a downward facing direction. Providing the operating criteria set forth above are employed, the operation of the thermophoretic pellicle described herein can be independent of orientation of the protected surface, although a higher temperature gradient may be required if the protected surface faces in an upward facing orientation to compensate for increased gravitational deposition.

We claim:

1. A method for protecting a surface from particle contamination in a low pressure environment, comprising:

a) providing a thermophoretic pellicle contained within a system chamber, the thermophoretic pellicle having walls comprising a material having a high electrical and thermal conductivity, and provided with at least one gas inlet means and at least one aperture that controls the rate of outflow of a gas to maintain a region of locally high pressure within the thermophoretic pellicle relative to a lower and sub-atmospheric pressure maintained in the system chamber by pumping means;

b) placing a substrate having a front and a back surface within the thermophoretic pellicle, the substrate having a surface to be protected from particle deposition, wherein the aperture provides line of sight access to the surface of the substrate from the system chamber, and wherein the gas inlet means and aperture are located to provide a flow of gas substantially parallel to and away from the surface of the substrate; and c) establishing and maintaining a temperature differential between the front surface of the substrate and the walls of the thermophoretic pellicle, wherein the front surface of the substrate is warmer than the walls of the thermophoretic pellicle; and d) eliminating the electric field between the front surface of the substrate and the walls of the thermophoretic pellicle.

2. The method of claim 1, further including orienting the front surface of the substrate in a downward facing orientation.

3. The method of claim 1, wherein said step of establishing includes heating the front surface of the substrate to a temperature higher than the walls of the enclosure.

4. The method of claim 1, wherein said step of establishing includes heating the back surface of the substrate.

5. The method of claim 1, wherein said step of establishing includes cooling the walls of the enclosure to a temperature below the temperature of the front surface of the substrate.

* * * * *